(12) United States Patent
Ayazi et al.

(10) Patent No.: US 7,977,136 B2
(45) Date of Patent: Jul. 12, 2011

(54) MICROELECTROMECHANICAL SYSTEMS STRUCTURES AND SELF-ALIGNED HIGH ASPECT-RATIO COMBINED POLY AND SINGLE-CRYSTAL SILICON FABRICATION PROCESSES FOR PRODUCING SAME

(75) Inventors: Farrokh Ayazi, Atlanta, GA (US); Mina Raieszadeh, Ann Arbor, MI (US); Pezhman Monadgemi, Fremont, CA (US)

(73) Assignee: Georgia Tech Research Corporation, Atlanta, GA (US)

( * ) Notice: Subject to any disclaimer, the term of this patent is extended or adjusted under 35 U.S.C. 154(b) by 352 days.

(21) Appl. No.: 12/319,650

(22) Filed: Jan. 10, 2009

(65) Prior Publication Data

US 2010/0176489 A1 Jul. 15, 2010

Related U.S. Application Data

(60) Provisional application No. 61/020,532, filed on Jan. 11, 2008.

(51) Int. Cl.
*H01L 21/00* (2006.01)
*H01L 21/461* (2006.01)

(52) U.S. Cl. ............. 438/48; 438/52; 438/53; 438/700; 438/702; 438/705; 438/735; 438/736

(58) Field of Classification Search .................. 438/48, 438/52, 53, 700, 702, 705, 735, 736
See application file for complete search history.

(56) References Cited

OTHER PUBLICATIONS

Tsai et al., "An isolated tunable capacitor with linear capacitance-voltage behavior," Transducers 2003, Boston, MA, Jun. 2003, pp. 833-836.
McCormick et al., "Ultra-wide tuning range silicon MEMS capacitors on glass with tera-ohm isolation and low parasitics," Transducers 2005, Seoul, Korea, Jun. 2005, pp. 1075-1079.
Ayazi et al., "High aspect-ratio combined poly and single-crystal silicon (HARPSS) MEMS technology," IEEE Journal of Microelectromechanical Systems, vol. 9, pp. 288-294, Sep. 2000.
Monajemi et al., "A high-Q low-voltage HARPSS tunable capacitor," IEEE IMS '05, Long Beach, CA, Jun. 2005, pp. 749-752.
Pourkamali et al., "High-Q single crystal silicon HARPSS capacitive beam resonators with sub-100-nm transduction gaps," IEEE Journal of Microelectromechanical Systems, vol. 12, No. 4, pp. 487-496.

*Primary Examiner* — Thanh V Pham
(74) *Attorney, Agent, or Firm* — Thomas, Kayden, Horstemeyer & Risley, LLP (57) ABSTRACT

Disclosed are one-port and two-port microelectromechanical structures including variable capacitors, switches, and filter devices. High aspect-ratio micromachining is used to implement low-voltage, large value tunable and fixed capacitors, and the like. Tunable capacitors can move in the plane of the substrate by the application of DC voltages and achieve greater than 240 percent of tuning. Exemplary microelectromechanical apparatus comprises a single crystalline silicon substrate, and a conductive structure laterally separated from the single crystalline silicon substrate by first and second high aspect ratio gaps of different size, wherein at least one of the high aspect ratio gaps has an aspect ratio of at least 30:1, and is vertically anchored to the single crystalline silicon substrate by way of silicon nitride.

9 Claims, 9 Drawing Sheets

MICROELECTROMECHANICAL SYSTEMS STRUCTURES AND SELF-ALIGNED HIGH ASPECT-RATIO COMBINED POLY AND SINGLE-CRYSTAL SILICON FABRICATION PROCESSES FOR PRODUCING SAME

CROSS REFERENCE TO RELATED APPLICATION

This application claims priority to co-pending U.S. provisional application entitled "Self-Aligned High Aspect-Ratio Poly- and Single-Crystal Silicon Variable Micromechanical Capacitor and Method of Fabrication" having Ser. No. 61/020,532, filed Jan. 11, 2008.

STATEMENT REGARDING FEDERALLY SPONSORED RESEARCH OR DEVELOPMENT

This invention was made with government support under agreement W15P7T-06-C-P635, awarded by the United States Army. The Government has certain rights in the invention.

BACKGROUND

The present invention relates to microelectromechanical systems (MEMS) fixed and tunable capacitors, filter devices, variable capacitors for energy harvesting, inertial sensors including accelerometers and gyroscopes, and related fabrication processes.

Large-value tunable and/or variable capacitors with small footprints are needed in a variety of applications, including low-frequency tunable filters and electrostatic energy harvesting devices. For example; energy harvesting variable capacitors require large capacitance variation on the order of 100 pF and greater. Although several designs of small-value micromechanical tunable capacitors have been reported in the literature, low actuation voltage tunable capacitors with large values in small form-factor are yet to be shown. See for example, C. Tsai, et al., "An isolated tunable capacitor with linear capacitance-voltage behavior," *Transducers* 2003, Boston, Mass., June 2003, pp. 833-836, and D. McCormick, et al., "Ultra-wide tuning range silicon MEMS capacitors on glass with tera-ohm isolation and low parasitics," *Transducers* 2005, Seoul, Korea, June 2005, pp. 1075-1079.

To achieve the highest density capacitors, three-dimensional interdigitated plates with narrow and high aspect-ratio vertical gaps are needed. The present inventors have previously developed a high aspect-ratio polysilicon and single crystal silicon (HARPSS) fabrication technique for the realization of high quality factor (Q) low-voltage one-port capacitors on silicon substrate. This is discussed by F. Ayazi and K. Najafi, in "High aspect-ratio combined poly and single-crystal silicon (HARPSS) MEMS technology," *IEEE Journal of Microelectromechanical Systems*, Vol. 9, pp. 288-294, September 2000, and P. Monajemi and F. Ayazi, "A high-Q low-voltage HARPSS tunable capacitor," *IEEE IMS* '05, Long Beach, Calif., June 2005, pp. 749-752.

Using this fabrication technique, vertical gaps are defined between polysilicon structures and silicon substrate by depositing thermal oxide (sacrificial oxide) and thus can be scaled to values less than 50 nm and aspect-ratio of more than 200. This is discussed by S. Pourkamali, et al., in "High-Q single crystal silicon HARPSS capacitive beam resonators with self-aligned sub-100-nm transduction gaps," *IEEE Journal of Microelectromechanical Systems*, Vol. 12, No. 4, pp. 487-496, August 2003.

This fabrication process is well-suited for fabricating high-value capacitors. However, the conventional HARPSS process does not offer different-size self-aligned narrow gaps between polysilicon and single crystal silicon structures, which is a required feature for high-performance tunable capacitors. For this reason, we have developed a modified version of HARPSS, called the self-aligned HARPSS to implement one-port and two-port tunable capacitors. Using this novel fabrication technique, tunable capacitors of different values are implemented in the bulk of a 70 μm thick silicon on insulator (SOI) substrate and are tuned by 240 percent with a tuning voltage as low as 3.5 V.

Thus, there is a need for improved variable capacitor apparatus for use in energy harvesting circuits, RF integrated circuits, and high-sensitivity micromechanical inertial sensors. There is also a need for improved one-port and two-port tunable capacitors for use in RF integrated circuits. There is also a need for a micro-fabrication method to produce low-voltage tunable capacitors.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Referring to the drawing figures, disclosed is a modified version of the high aspect-ratio polysilicon and single crystal silicon (HARPSS) fabrication technique 30, referred to as a self-aligned HARPSS fabrication process 30 or technique 30 for producing microelectromechanical apparatus 10, such as one-port and two-port fixed and tunable capacitors 10, filter devices and similar structures. For example, using this self-aligned HARPSS fabrication technique 30, reduced-to-practice tunable capacitors 10 of different values have been implemented in a 60-80 μm thick bulk silicon-on-insulator (SOI) substrate 11, or single crystalline silicon substrate 11, which may be tuned by 240 percent with a tuning voltage as low as 3.5 V.

Fabrication

FIGS. 1a-1f show an exemplary fabrication process flow of the self-aligned HARPSS fabrication process 30, requiring only three lithography masks. In this process 30, a sub-micron high aspect-ratio vertical capacitive air gap 22 (FIG. 1g) is defined by thermally growing a thin layer of sacrificial silicon dioxide 17 (FIGS. 1c-1f). Wider vertical gaps 21 (FIG. 1g) of different sizes are defined using silicon nitride 14 in a self-aligned manner. Silicon nitride 14 is used because it acts as a mask during the thermal growth of silicon dioxide 17 and is etched back from the surface at a final step to define trenches 22 (FIG. 1f) in the silicon-on-insulator (SOI) substrate 11, or single crystalline silicon substrate 11.

Figure 1A:
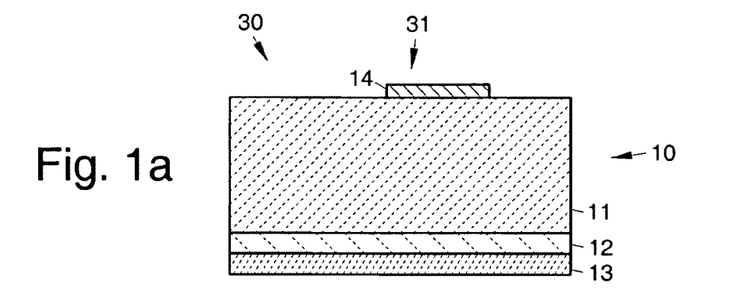
FIGS. 1a-1g illustrates an exemplary surface micromachining fabrication method for producing tunable capacitors.
Figure 1B:
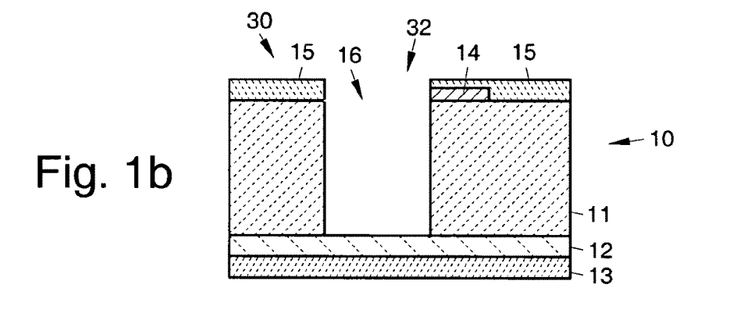

More specifically, and referring to FIG. 1a, an exemplary process 30 starts with a SOI substrate comprising a silicon handle layer 13, a silicon device layer 11, and a buried oxide layer 12 disposed between the handle layer 13 and the device layer 11. A 3000 Å LPCVD layer of silicon nitride 14 is deposited and patterned 31 on the device layer 11 of the SOI substrate. Next, as is shown in FIG. 1b, trenches 16 are etched 32 into the device layer 11 of the SOI substrate using photoresist 15 as a mask.

Figure 1C:
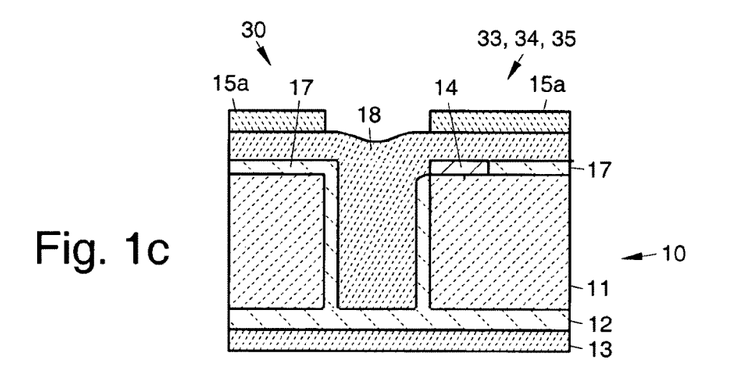
Figure 1D:
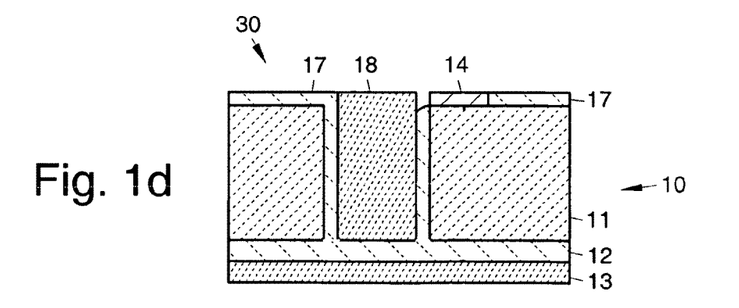

As is shown in FIG. 1c, a thin layer of sacrificial silicon dioxide 17 (<1 μm) is thermally grown 33 at about 950° C. The oxide growth temperature is reduced to minimize stress. The trenches 16 are then filled 34 with a non-silicon structure 18, such as LPCVD polysilicon 18, boron-doped and annealed. Annealing parameters of polysilicon heavily influence the residual stress of the thin film layer of sacrificial silicon dioxide 17, which affects the performance of movable structures, as will be discussed below. The polysilicon 18 is subsequently patterned 35 using photoresist 15a as a mask (FIG. 1c) resulting in the structure shown in FIG. 1d.

Figure 1E:
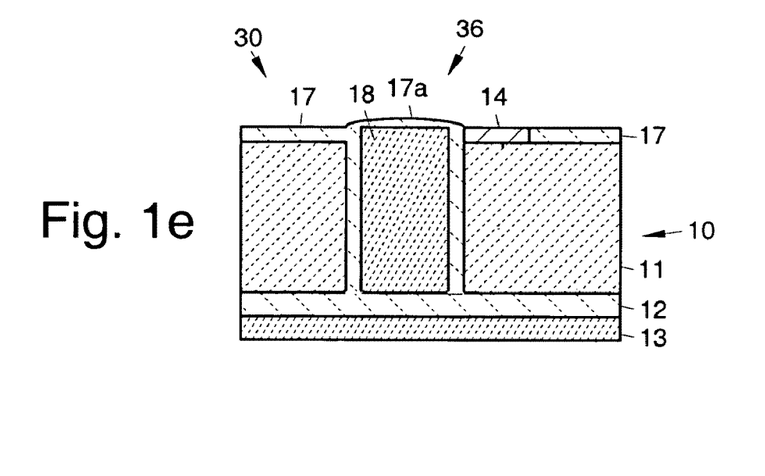
Figure 1F:
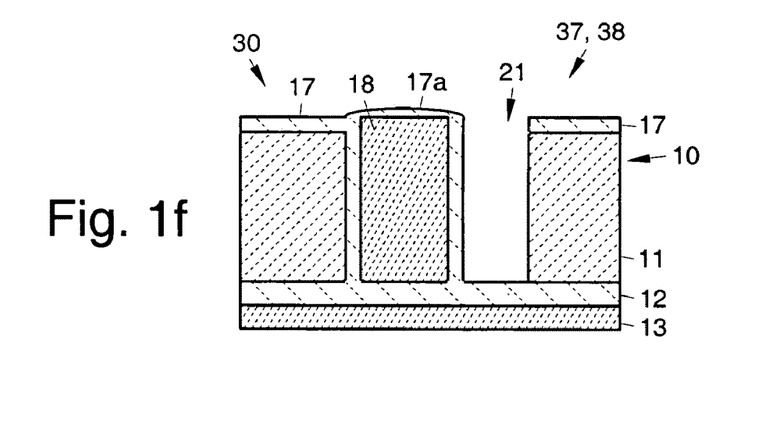
Figure 1G:
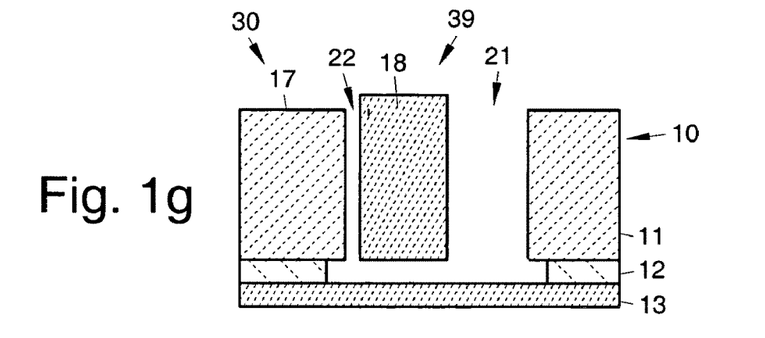

As is shown in FIG. 1e, a layer of silicon dioxide 17a is grown 36 to protect the polysilicon 18 in a final silicon etching step. As is shown in FIG. 1f, the layer of silicon nitride 14 is then removed by reactive ion etching 37 and the self-aligned isolating trenches 21 are etched 38 into the device layer 11. Finally, as is shown in FIG. 1g, the polysilicon 18 (polysilicon devices 18 or structures 18) are released 39 in hydrofluoric acid. Using this fabrication process 30, prototype one-port and two-port tunable capacitors 10 have been designed and fabricated.

Design

Figure 2:
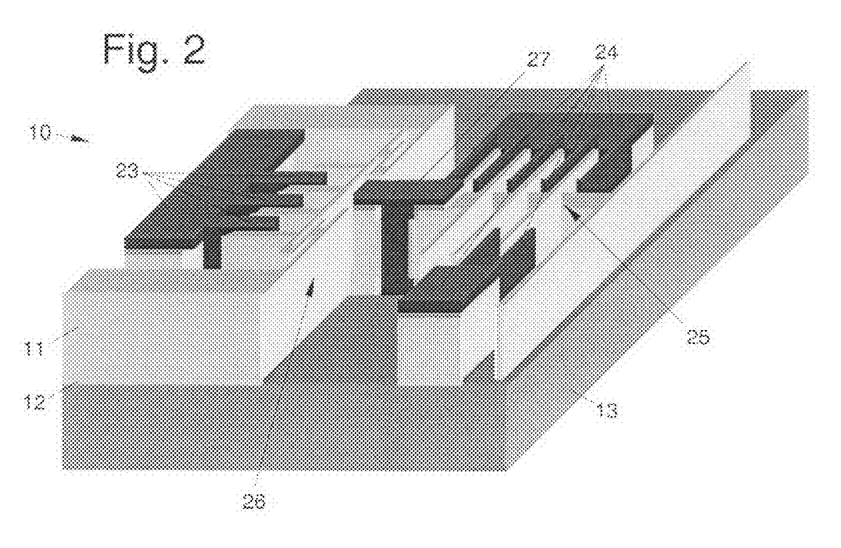
FIG. 2 is a schematic of an exemplary two-port tunable capacitor.

A schematic diagram of an exemplary two-port tunable capacitor 10 is shown in FIG. 2. The exemplary two-port tunable capacitor 10 comprises a comb-drive actuator 23, a parallel-plate capacitor 24, a silicon shuttle 25, a spring 26, and a polysilicon clamp 27.

To maximize electrostatic tuning, the actuator 23 is designed with a comb-drive configuration and the capacitor 10 is a parallel-plate type capacitor 10. The sub-micron gap 22 produced using the self-aligned HARPSS process 30 makes the realization of large-value capacitors 10 as well as low tuning voltage actuators 23 possible.

The main challenge in designing the two-port tunable capacitor 10 is to electrically isolate the movable parallel plates 24 of the tunable capacitor 10 from the actuator 23 while maintaining a mechanical connection. This has also been achieved using the fabrication process 30 without additional complexity. Such a connection is provided by the polysilicon clamp 27 that is electrically isolated from the parallel plates 24 and the actuator 23 using sacrificial oxide 17 in the bulk silicon device layer 11 and nitride 14 on the surface.

Figure 3:
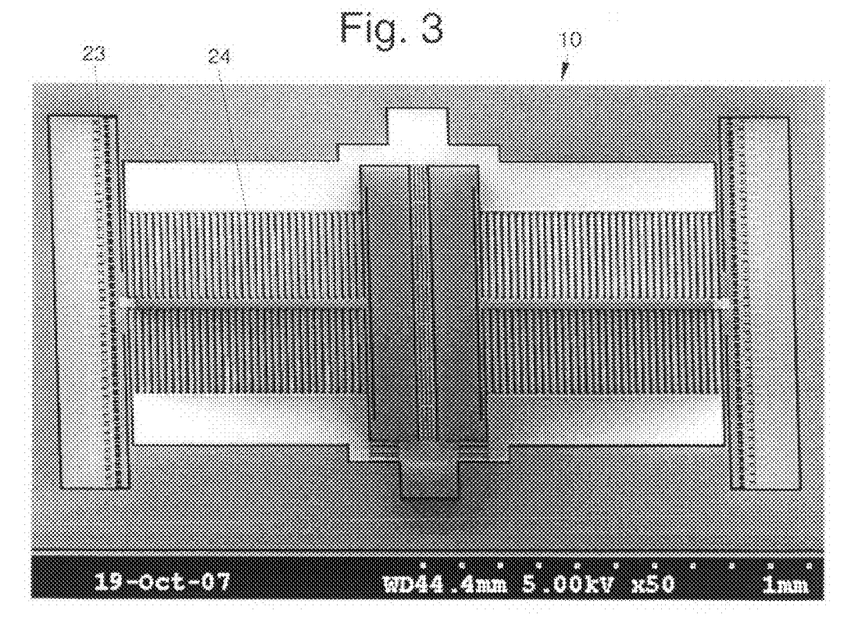
FIG. 3 is a SEM view of a 15 pF two-port tunable HARPSS capacitor fabricated on a 70 μm thick SOI substrate.
Figure 4A:
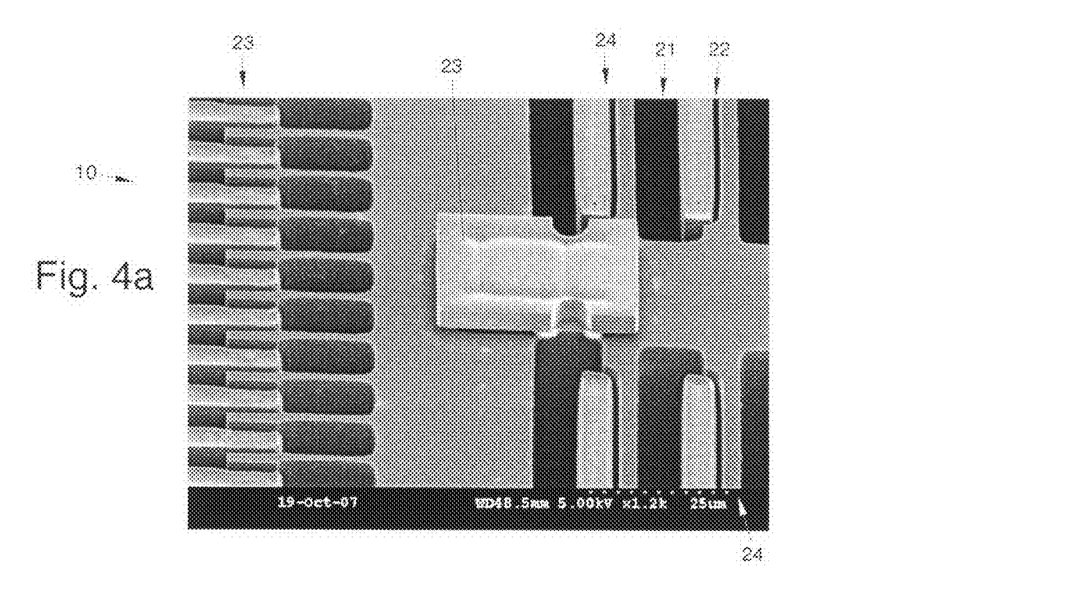
FIG. 4a shows a SEM view of a polysilicon clamp of the capacitor shown in FIG. 2.
Figure 4B:
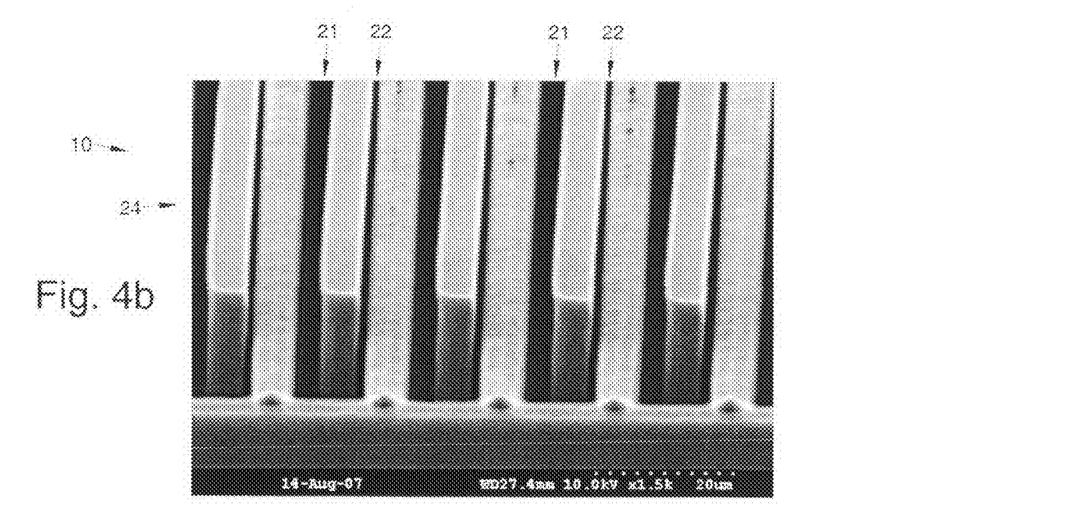
FIG. 4b shows a SEM close-up view of the 800 nm gap between parallel-plates of the capacitor shown in FIG. 2.
Figure 5:
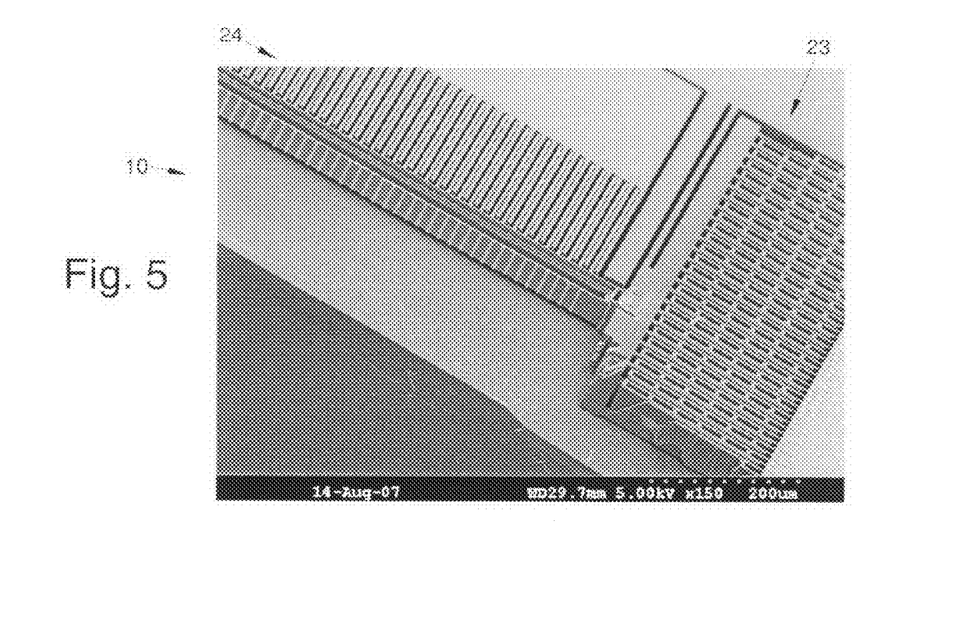
FIG. 5 is a SEM view of a broken capacitor, showing the 60 μm thick device on SOI substrate.

If one-port capacitors 10 are desired, the clamp 27 is not needed and the solid silicon shuttle 25 connects the actuator 23 to the parallel-s 24. FIG. 3 shows a SEM view of a two-port tunable capacitor 10. FIG. 4 shows close-up views of the polysilicon clamp 27 and the sub-micron capacitive gap 22. The capacitor 10 is realized on a 70 μm thick SOI substrate with a low resistivity of <0.001 ohm-cm. FIG. 5 is a SEM view of a broken capacitor 10 showing the 60 μm thick device 10 on an SOI substrate. To minimize the sensitivity to external acceleration, the two-port capacitor 10 is made symmetric about both x and y axes, as shown in FIG. 3.

In general terms, the modified HARPSS process 30 may be used to fabricate improved microelectromechanical apparatus 10 including fixed and tunable capacitors 10 and filter devices, and the like. The microelectromechanical apparatus 10 comprise a single crystalline silicon substrate 11 and a conductive structure 18 laterally separated from the single crystalline silicon substrate 11 by first and second high aspect ratio gaps 21, 22, wherein at least one of the high aspect ratio gaps 22 has an aspect ratio of at least 30:1 and vertically anchored to the single crystalline silicon substrate 10 by way of silicon nitride 18. The conductive structure 18 may be selected from a group of materials including polycrystalline silicon, germanium, polycrystalline silicon germanium, tungsten, sputtered metal and electroplated metal.

Results

Figure 6:
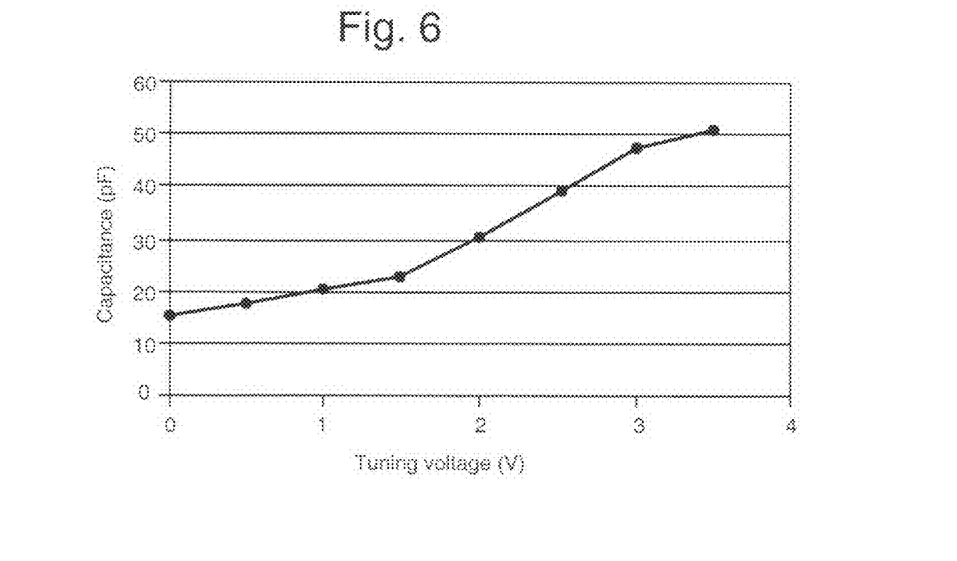
FIG. 6 shows a C-V tuning curve of a 15 pF two-port HARPSS capacitor, showing a maximum tuning of 240 percent.
Figure 7:
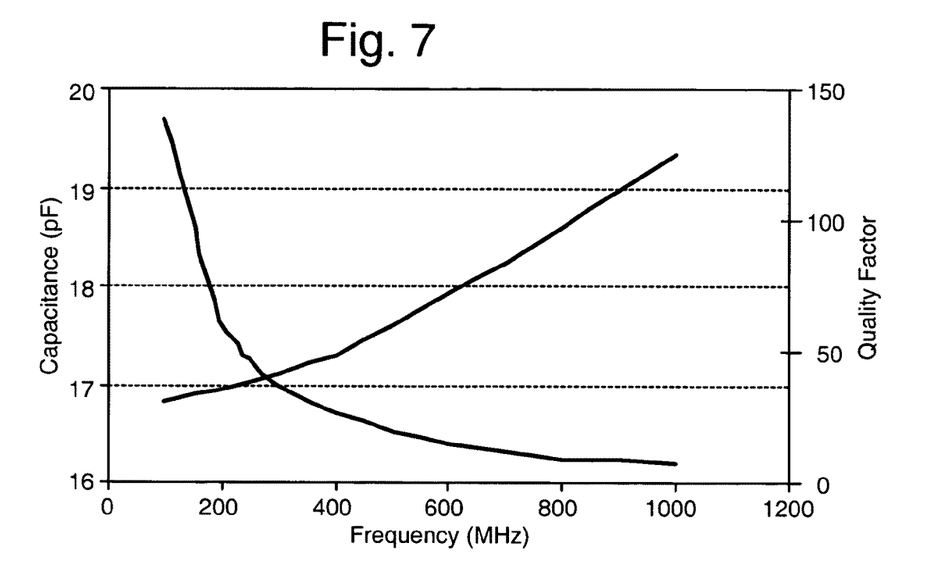
FIG. 7 shows simulation results of the 15 pF tunable capacitor.

DC tuning voltages are applied to the actuator 23 and the capacitance values may be measured at 2 MHz using an Agilent E4980A precision LCR meter. FIG. 6 shows the measured C-V tuning curve of a 15 pF two-port tunable capacitor 10. As shown, this capacitor 10 is continuously tuned to 51 pF with the application of 3.5 V. The capacitor 10 was simulated using Ansoft HFSS full-wave EM solver. FIG. 7 shows the result of the simulation. The resistivity of the polysilicon 18 is assumed to be the same as the silicon substrate, which is 0.001 ohm-cm. The resistivity of polysilicon 18 in the fabricated device is 0.04 ohm-cm, resulting in a lower measured quality factor than that predicted by the simulations. The simulated capacitance value, on the other hand, is in good agreement with the measured result.

Figure 8:
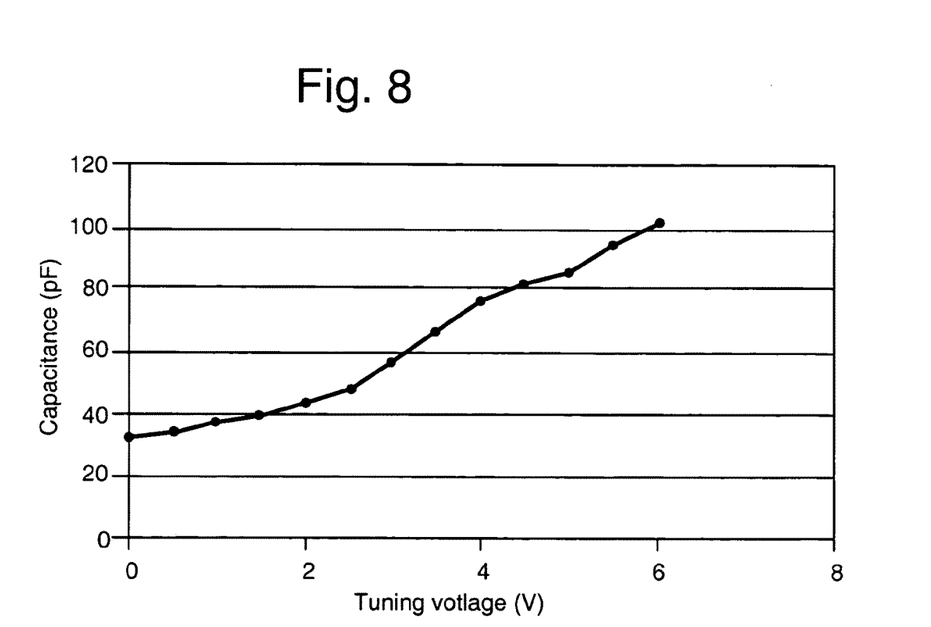
FIG. 8 is a C-V tuning curve of a 32 pF two-port HARPSS capacitor, showing a maximum tuning of 218 percent.

The implementation of larger value capacitors 10 becomes more challenging as the movable shuttle 25 gets longer, hence increasing the possibility of stiction to the handle layer 11. This can be taken care of by using a thicker buried oxide layer 12. The residual stress in the polysilicon 18 is also more pronounced in larger devices, leading to bending of structures that hampers device performance. Therefore, controlling the deposition and annealing parameters (pressure, gas flow rate, temperature, and time) of the polysilicon 18 is crucial to the successful fabrication of large-value capacitors 10. By characterizing the process parameters, 32 pF and 106 pF tunable capacitors 10 were successfully fabricated. The tuning curve of the 32 pF two-port tunable capacitor 10 is shown in FIG. 8. A maximum capacitance change of 218 percent is observed for this capacitor with a tuning voltage of 6 V.

Figure 9A:
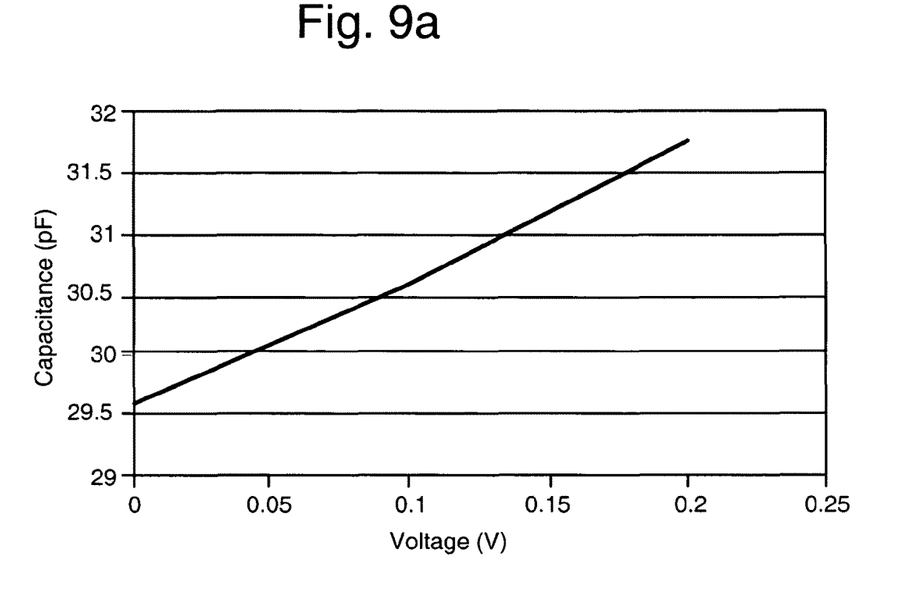
FIG. 9a shows a tuning curve of the actuation port of a 60 μm thick tunable capacitor.
Figure 9B:
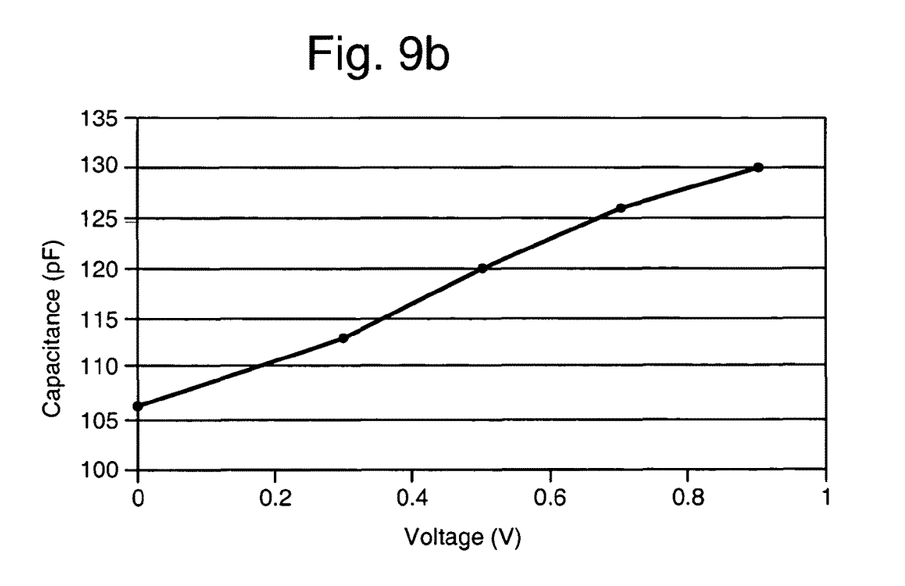
FIG. 9b shows a tuning curve of the parallel-plate sense port of a 60 μm thick tunable capacitor.

FIGS. 9a and 9b show tuning curves of an actuation port and a parallel plate port of a 60 μm thick 106 pF one-port tunable capacitor 10, respectively. As expected, the comb-drive capacitance changes linearly with the applied DC voltage. The large parallel-plate capacitor 10 with an air gap 22 aspect-ratio of 60 varies over 23.5 pF with the application of only 0.9 V. This capacitor 10 occupies 8 mm by 1 mm of die area and can be further reduced in size by increasing the aspect-ratio of the capacitive gap 22, which is feasible using the disclosed self-aligned HARPSS process 30.

Ideally, the design provides infinite tuning as the parallel-plate gap 22 can be reduced to very small values with an actuation travel range of <1 μm. An issue that impedes an ideal tuning is that fingers of the comb-drive actuator 23 are not straight due to the non-ideal trench profile and residual stress in the polysilicon 18, which leads to the lateral snapping of the fingers of the comb-drive actuator 23.

Figure 10:
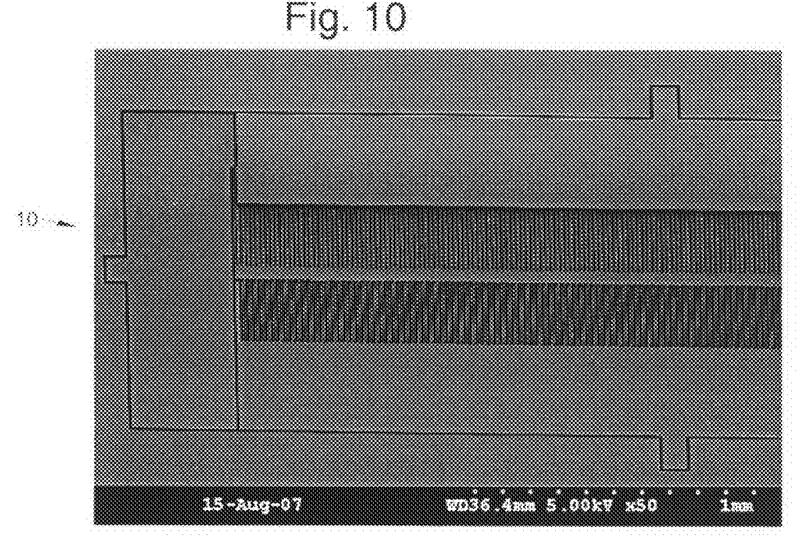
FIG. 10 is a SEM view of a one-port HARPSS tunable capacitor with lithographically defined parallel-plate actuator.
Figure 11:
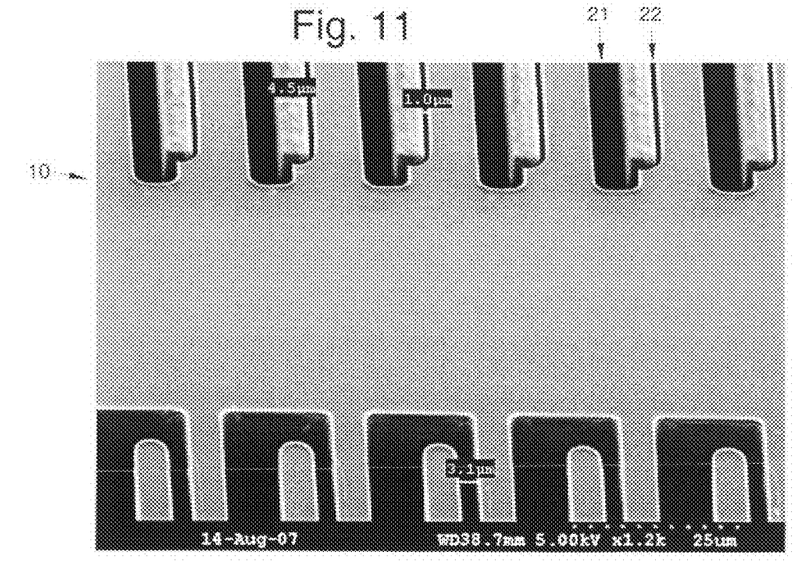
FIG. 11 is a close-up SEM view of the one-port HARPSS tunable capacitor with lithographically defined parallel-plate actuator.

To appreciate the low tuning voltage of the HARPSS actuator 23, a one-port capacitor 10 was designed with a lithographically-defined parallel-plate actuator 23 (FIG. 10). A close-up SEM view of this capacitor 10 shown in FIG. 11 compares a sub-micron HARPSS gap 22 with lithographically defined capacitive gaps 21 at the actuator 23.

Figure 12:
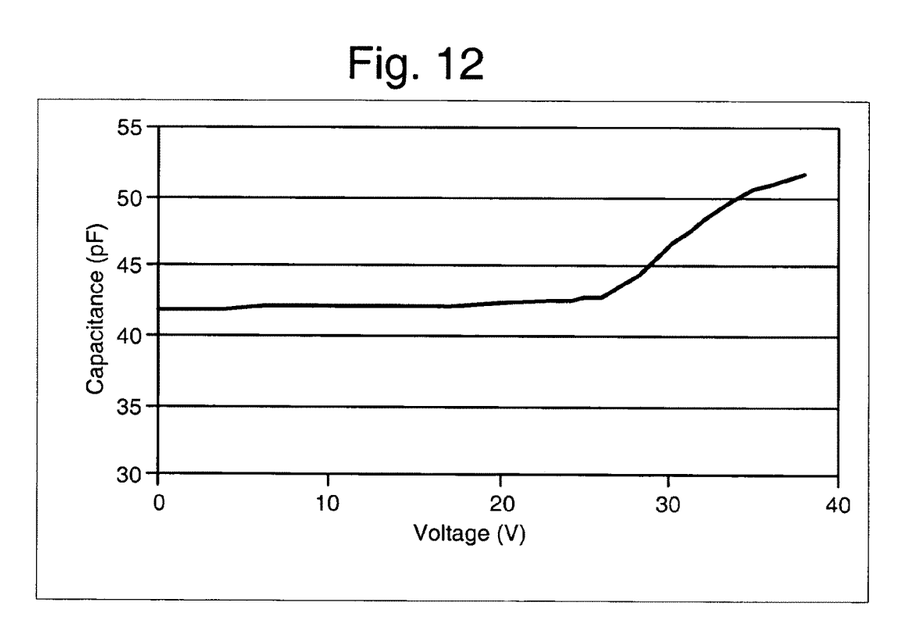
FIG. 12 is a C-V tuning curve of a 42 pF one-port HARPSS capacitor with lithographically-defined parallel-plate actuator, and wherein tuning voltages are high as a result of larger actuation gaps.

FIG. 12 shows the tuning result obtained for the large-value capacitor 10 shown in FIG. 10. Compared to tuning voltages obtained for parallel-plate HARPSS capacitors 10 (shown in FIG. 9), the actuation voltage has increased to more than 25 V as a result of a larger gap 22 and lesser actuator capacitance density.

Thus, an improved self-aligned HARPSS fabrication process 30 has been described for producing improved microelectromechanical apparatus 10 such as low-voltage capacitors 10 and filters. This process 30 offers the possibility of having a sub-micron capacitive HARPSS gap 22 together with several self-aligned gaps 21, which are not achievable using a conventional HARPSS process. Using this disclosed fabrication process 30, exemplary large-value low-voltage two-port tunable capacitors have been produced. With a capacitive HARPSS gap 22 of 800 nm and an aspect-ratio of 87, a maximum tuning of 240 percent was observed for a 15 pF two-port tunable capacitor 10 fabricated on a 70 μm thick SOI substrate 11. Using the disclosed fabrication process 30, the aspect-ratio of such capacitors 10 can easily be extended to more than 200, yielding much larger-value capacitors 10 in the same die area.

It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:
1. A process for fabricating a movable micromechanical apparatus, comprising:
providing a substrate;
depositing and patterning a silicon nitride layer on the substrate that defines a first etch mask;
etching trenches into the substrate using a second etch mask to define a conductive structure;
forming a conformal silicon dioxide layer on the trenched substrate;
depositing a conductive material in the trenches;
doping and patterning the deposited conductive material;
forming a silicon dioxide layer to cover the conductive material and provide a third etch mask;
etching the silicon nitride layer to form self-aligned trenches in the substrate;
etching the silicon substrate; and
removing the silicon dioxide to release the conductive material from the substrate and form a first and second different size gaps between the conductive material and the substrate.

2. A process for fabricating a variable capacitor apparatus, comprising:
providing a substrate;
depositing and patterning a silicon nitride layer on the substrate that defines a first etch mask;
etching trenches into the substrate using a second etch mask to define a first set of fingers of an actuator and a parallel-plate capacitor;
forming a conformal silicon dioxide layer on the trenched substrate;
depositing a conductive material in the trenches;
doping and patterning the deposited conductive material;
forming a silicon dioxide layer to cover the conductive material and provide a third etch mask;
etching the silicon nitride layer to form self-aligned trenches in the substrate;
etching the silicon substrate to form a second set of fingers of the actuator and the parallel-plate capacitor; and
removing the silicon dioxide to release the conductive material from the substrate and form a first and second different size gaps between the conductive material and the substrate and fabricate the capacitor apparatus.

3. Microelectromechanical apparatus fabricated by the process according to claim 1 or 2, comprising:
a single crystalline silicon substrate; and
a conductive structure laterally separated from the single crystalline silicon substrate by first and second high aspect ratio gaps of different size, wherein at least one of the high aspect ratio gaps has an aspect ratio of at least 30:1.

4. The apparatus recited in claim 3 wherein the conductive structure is selected from a group including polycrystalline silicon, germanium, polycrystalline silicon germanium, tungsten, sputtered metal and electroplated metal.

5. The apparatus recited in claim 3 wherein the conductive structure is separated from the single crystalline silicon substrate by first and second high aspect ratio air gaps of different size, and the conductive structure is movable so as to provide a variable capacitor apparatus.

6. The apparatus recited in claim 3 wherein the conductive structure is separated from the single crystalline silicon substrate by a first gap comprising a non-air dielectric-filled high aspect ratio gap, and a second gap comprising a high aspect ratio substantially air-filled gap, and the conductive structure is fixed.

7. The apparatus recited in claim 3 wherein the high aspect ratio gap having the aspect ratio of at least 30:1 has a width between 10 nm and 2 μm.

8. The apparatus recited in claim 3 wherein the substrate comprises a silicon on insulator substrate.

9. The apparatus recited in claim 3 wherein the conductive structure is anchored to the single crystalline silicon substrate via a silicon nitride layer.

* * * * *